(12) United States Patent
Wakamoto (10) Patent No.: US 9,623,435 B2
(45) Date of Patent: Apr. 18, 2017

(54) SUBSTRATE PROCESSING APPARATUS FOR COATING LIQUID COMPOSED OF FIRST COATING LIQUID AND SECOND COATING LIQUID ON SUBSTRATE WITH SLIT-SHAPED EJECTION PORT

(71) Applicant: TOKYO ELECTRON LIMITED, Tokyo (JP)

(72) Inventor: Yukihiro Wakamoto, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/813,590

(22) Filed: Jul. 30, 2015

(65) Prior Publication Data

US 2016/0038965 A1    Feb. 11, 2016

(30) Foreign Application Priority Data

Aug. 11, 2014    (JP) .................................. 2014-163468

(51) Int. Cl.

| | |
|---|---|
| *B05C 9/02* | (2006.01) |
| *B05C 9/06* | (2006.01) |
| *B05C 5/02* | (2006.01) |
| *H01L 21/00* | (2006.01) |
| *B05C 11/10* | (2006.01) |
| *H01L 21/67* | (2006.01) |
| *G03F 7/16* | (2006.01) |

(52) U.S. Cl.
CPC .............. *B05C 5/0254* (2013.01); *B05C 9/02* (2013.01); *B05C 9/06* (2013.01); *B05C 11/1002* (2013.01); *B05C 11/1005* (2013.01); *H01L 21/6715* (2013.01); *H01L 21/67051* (2013.01); *H01L 21/67155* (2013.01); *H01L 21/67173* (2013.01); *B05C 5/0216* (2013.01); *G03F 7/162* (2013.01)

(58) Field of Classification Search
None
See application file for complete search history.

(56) References Cited

U.S. PATENT DOCUMENTS

| | | | | |
|---|---|---|---|---|
| 6,033,728 A | * | 3/2000 | Kikuchi | .................. G03F 7/162 |
| | | | | 438/780 |
| 6,382,849 B1 | * | 5/2002 | Sakamoto | ................ G03D 5/00 |
| | | | | 118/666 |
| 2011/0059250 A1 | * | 3/2011 | Miyamoto | .......... H01L 21/6715 |
| | | | | 118/64 |
| 2014/0038423 A1 | * | 2/2014 | Iwao | ................. H01L 21/67051 |
| | | | | 438/758 |

FOREIGN PATENT DOCUMENTS

JP    2011-167603 A    9/2011

* cited by examiner

*Primary Examiner* — Binu Thomas
(74) *Attorney, Agent, or Firm* — Abelman, Frayne & Schwab (57) ABSTRACT

Disclosed is a substrate processing apparatus. The substrate processing apparatus includes a moving mechanism that moves a wafer in a horizontal direction, coating sections that eject the coating liquid to the wafer, and dry sections that dries the coating liquid, and a controller that controls the drying sections, the coating sections, and the moving mechanism. In each coating section, the wafer is moved in the horizontal direction while causing the coating liquid to be in contact with the wafer so that the coating liquid is coated on the entire surface.

11 Claims, 8 Drawing Sheets

SUBSTRATE PROCESSING APPARATUS FOR COATING LIQUID COMPOSED OF FIRST COATING LIQUID AND SECOND COATING LIQUID ON SUBSTRATE WITH SLIT-SHAPED EJECTION PORT

CROSS-REFERENCE TO RELATED APPLICATIONS

This application is based on and claims priority from Japanese Patent Application No. 2014-163468 filed on Aug. 11, 2014 with the Japan Patent Office, the disclosure of which is incorporated herein in its entirety by reference.

TECHNICAL FIELD

The present disclosure relates to a substrate processing apparatus for coating a coating liquid on a substrate.

BACKGROUND

Conventionally, as a method of coating a coating liquid on a substrate such as, for example, a semiconductor wafer or a glass substrate, a so-called spin coating method has been widely known. The spin coating method supplies a coating liquid from a coating nozzle to the center of a substrate while rotating the substrate so that the coating liquid is spread over the substrate by a centrifugal force and thus coated on the surface of the substrate.

In the case of using the spin coating method, the coating liquid supplied to the substrate is spread by a high speed rotation, and thus most of the supplied coating liquid is scattered and wasted from the outer peripheral portion of the substrate.

Therefore, in order to reduce the waste of such a coating liquid, for example, Japanese Patent Laid-open Publication No. 2011-167603 has suggested a method of coating a coating liquid on a substrate by drawing out the coating liquid by a capillary phenomenon from an ejection port of a coating nozzle (hereinafter, sometimes referred to as a "capillary coating method"). Specifically, the slit-like ejection port formed in the lower end part of the coating nozzle is moved close to the substrate, and a predetermined gap is formed and maintained between the ejection port and the substrate. Then, the coating liquid ejected from the ejection port is caused to be in contact with the substrate, and in that state, the substrate and the coating nozzle are relatively moved in a horizontal direction, for example, in a radial direction of the substrate. Consequently, the coating liquid is drawn out of the ejection port by the capillary phenomenon and the coating liquid is coated on the substrate.

SUMMARY

In order to achieve the objects described above, the present disclosure discloses a substrate processing apparatus for coating a coating liquid on a substrate. The substrate processing apparatus includes: a coating section configured to eject the coating liquid to the substrate; a moving mechanism configured to relatively move the substrate and the coating section in a horizontal direction; and a controller configured to control the coating section and the moving mechanism. The controller controls the coating section and the moving mechanism to perform a first step of ejecting and coating the coating liquid at least on an outer peripheral portion of the substrate from the coating section, and a second step of coating the coating liquid on an entire surface of the substrate by relatively moving the substrate and the coating section in the horizontal direction by the moving mechanism while causing the coating liquid ejected from the coating section to be in contact with the substrate.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

In the following detailed description, reference is made to the accompanying drawings, which form a part hereof. The exemplary embodiments described in the detailed description, drawings, and claims are not meant to be limiting. Other exemplary embodiments may be utilized, and other changes may be made without departing from the spirit or scope of the subject matter presented here.

The present inventors have conducted intensive researches and found that, when a coating liquid is coated on a substrate by a capillary coating method as described in Japanese Patent Application Laid-open No. 2011-167603 above, the coating liquid swells in the outer peripheral portion of the substrate, thus forming a hump. That is, the coating liquid may not be uniformly coated the substrate plane from the central portion to the outer peripheral portion thereof.

Especially, the capillary coating method is usually used for coating a coating liquid with a large film thickness due to the chemical liquid saving effect. As the film thickness increases, a large amount of the coating liquid is required. Therefore, the above-described hump is prominent.

The hump may occur even in the case of using the spin coating method. In the spin coating method, however, because the centrifugal force acts on the coating liquid by rotation of the substrate, the height and width of the hump are relatively small. Whereas, in the capillary coating method, the centrifugal force does not act on the coating liquid as described above, and the height and width of the hump tend to be largely formed by the action of surface tension of the coating liquid.

The present disclosure has been made in view of the above-described problems, and an object of the present disclosure is to uniformly coat a coating liquid in a substrate plane while suppressing the supply amount of the coating liquid to be coated on the substrate to a small amount.

In order to achieve the object described above, the present disclosure provides a substrate processing apparatus for coating a coating liquid on a substrate. The apparatus includes: a coating section configured to eject the coating liquid to the substrate, a moving mechanism configured to relatively move the substrate and the coating section in a horizontal direction, and a controller configured to control the coating section and the moving mechanism. The controller controls the coating section and the moving mechanism to perform a first step of ejecting and coating the coating liquid at least on an outer peripheral portion of the substrate from the coating section, and a second step of coating the coating liquid on an entire surface of the substrate by relatively moving the substrate and the coating section in the horizontal direction by the moving mechanism while causing the coating liquid ejected from the coating section to be in contact with the substrate.

Here, in the capillary coating method used in the second coating step of the present disclosure, the film thickness of the coating liquid coated on the surface of the substrate is controlled by controlling the distance between the surface of the substrate and the ejection port of the coating section. That is, when the distance is increased, the film thickness of the coating liquid is increased. When the distance is decreased, the film thickness of the coating liquid is decreased.

According to the present disclosure, since the coating liquid is coated at least on the outer peripheral portion of the substrate in the first coating step, the coating liquid swells in the outer peripheral portion. That is, for example, when the coating liquid is coated on the entire surface of the substrate using the capillary coating method in the first coating step, the coating liquid swells in the outer peripheral portion of the substrate as described above. Further, for example, when the coating liquid is coated only in the outer peripheral portion of the substrate in the first coating step, it is natural that the coating liquid of the outer peripheral portion swells.

Then, in the second coating step, the distance between the surface of the coating liquid of the outer peripheral portion of the substrate and the ejection port of the coating section becomes smaller than the distance between the surface of the inner peripheral portion (the surface of the substrate or the surface of the coating liquid) and the ejection port of the coating section. In such a case, since the film thickness of the coating liquid coated in the outer peripheral portion from the coating section is controlled to be smaller than the film thickness of the coating liquid coated in the inner peripheral portion, the inner peripheral portion and the outer peripheral portion of the coating liquid may have the same surface height. Therefore, the coating liquid may be uniformly coated in the substrate plane.

Moreover, in the present disclosure, since the capillary coating method is used at least in the second coating step, the coating liquid supplied to the substrate does not flow out from the substrate so that only the required amount of the coating liquid may be supplied to the substrate. Thus, the supply amount of the coating liquid may be reduced, for example, as compared with the spin coating method.

In the first coating step, the controller may control the coating section and the moving mechanism such that the substrate and the coating section are relatively moved in the horizontal direction by the moving mechanism while causing the coating liquid ejected from the coating section to be in contact with the substrate so as to coat the coating liquid on the entire surface of the substrate.

In the first coating step, the controller may control the coating section to eject and coat the coating liquid only in the outer peripheral portion of the substrate from the coating section.

The controller may set a target film thickness of the coating liquid in the first coating step and a target film thickness of the coating liquid in the second coating step to be equal to each other.

The controller may control the coating section and the moving mechanism to perform the second coating steps multiple times. In this case, the controller may set the target film thicknesses of the coating liquid in respective coating steps to be equal to each other.

The substrate processing apparatus may further include a drying section configured to dry the coating liquid coted on the substrate from the coating section. The controller may control the drying section to perform a first drying step of drying the coating liquid coated in the first coating step by the drying section, after the first coating step and before the second coating step, and a second drying step of drying the coating liquid coated in the second coating step by the drying section, after the second coating step.

The coating section and the drying section may be disposed in the same processing apparatus. Alternatively, the drying section and the coating section may be disposed in different processing apparatuses.

The drying section may dry the coating liquid by heating the substrate. Alternatively, the drying section may dry the coating liquid by decompressing the atmosphere around the substrate.

According to the present invention, the coating liquid may be uniformly coated in the substrate plane while suppressing the supply amount of the coating liquid to a small amount.

Hereinafter, exemplary embodiments of the present disclosure will be described with reference to the accompanying drawings. However, the present disclosure is not limited by the exemplary embodiments disclosed below.

Figure 1:
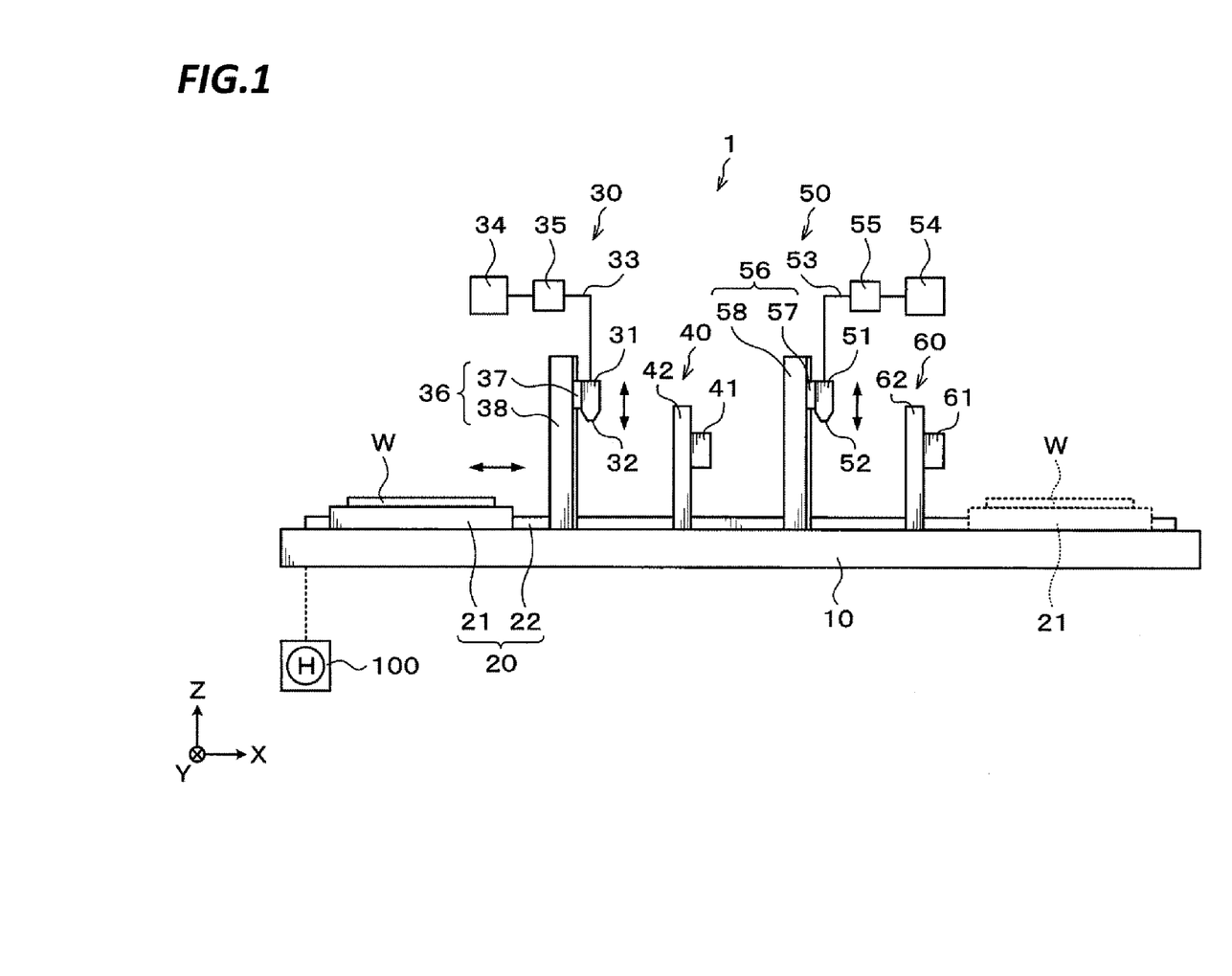
FIG. 1 is a schematic side view illustrating a configuration of a substrate processing apparatus according to an exemplary embodiment.
Figure 2:
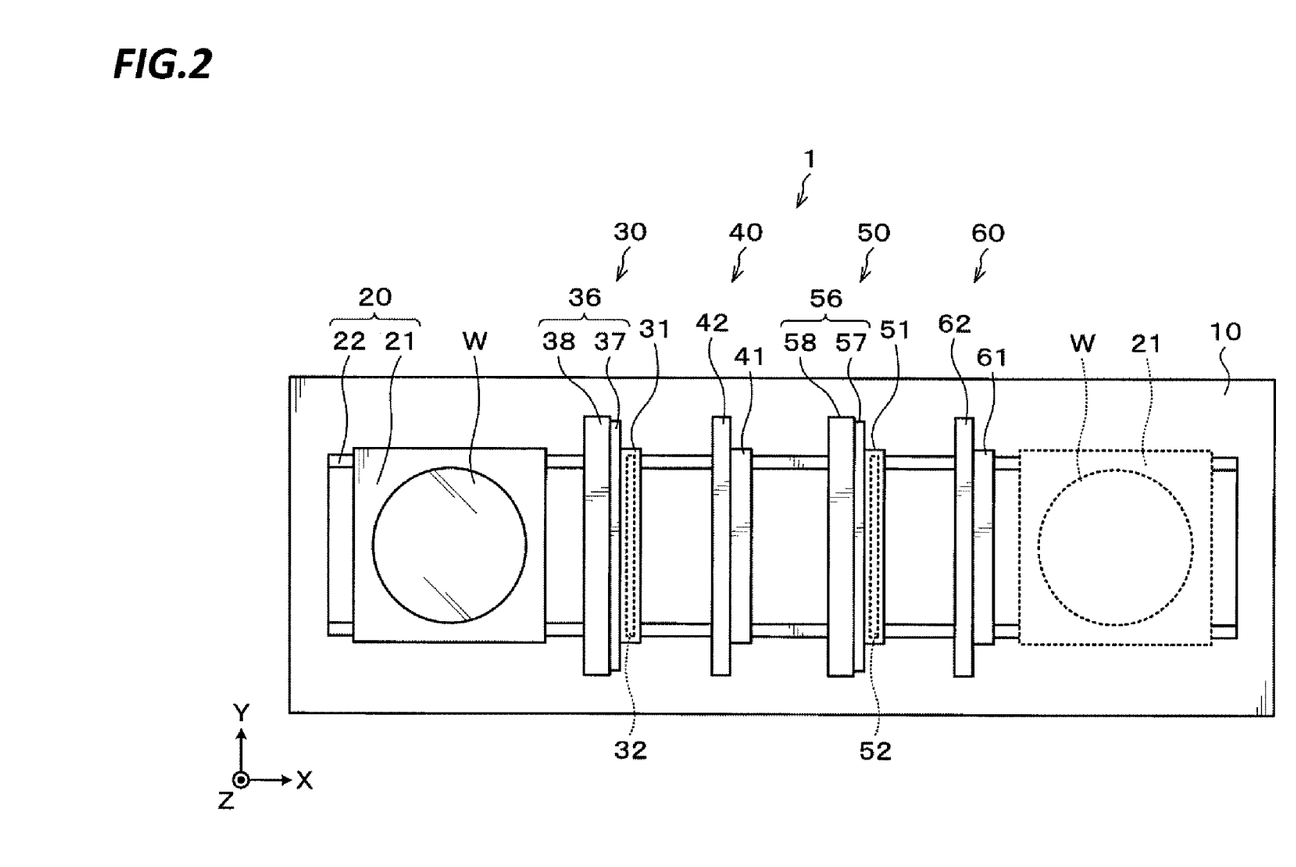
FIG. 2 is a schematic plan view illustrating the configuration of the substrate processing apparatus according to the exemplary embodiment.

First, a configuration of a substrate processing apparatus according to an exemplary embodiment will be described with reference to FIGS. 1 and 2. FIG. 1 is a schematic side view illustrating a configuration of the substrate processing apparatus 1 according to an exemplary embodiment. FIG. 2 is a schematic plan view illustrating the configuration of the substrate processing apparatus 1 according to the present exemplary embodiment. In the following, in order to clarify the positional relationship, X-axis, Y-axis and Z-axis directions which are perpendicular to each other are defined and the positive Z-axis direction is regarded as a vertical upward direction. Since the easy understanding of technologies is considered first, the dimension of each component does not necessarily correspond to the actual dimension.

As illustrated in FIGS. 1 and 2, the substrate processing apparatus 1 includes a mounting table 10, a moving mechanism 20, a first coating section 30, a first drying section 40, a second coating section 50, and a second drying section 60. The first coating section 30, the first drying section 40, the second coating section 50, and the second drying section 60 are disposed in this order in the moving direction of the wafer W (X-axis direction) on the mounting table 10.

The moving mechanism 20 is a mechanism for moving wafer W as a substrate in the horizontal direction (X-axis direction), and includes a wafer holding unit 21 and a drive unit 22. The wafer holding unit 21 includes a horizontal upper surface which is formed with a suction port (not illustrated), and sucks and holds the wafer W on the horizontal upper surface by suction from the suction port. The drive unit 22 is provided in the mounting table 10 so as to move the wafer holding unit 21 in the horizontal direction. The moving mechanism 20 moves the wafer holding unit 21 using the drive unit 22, thereby moving the wafer W held by the wafer holding unit 21 in the horizontal direction.

Figure 3:
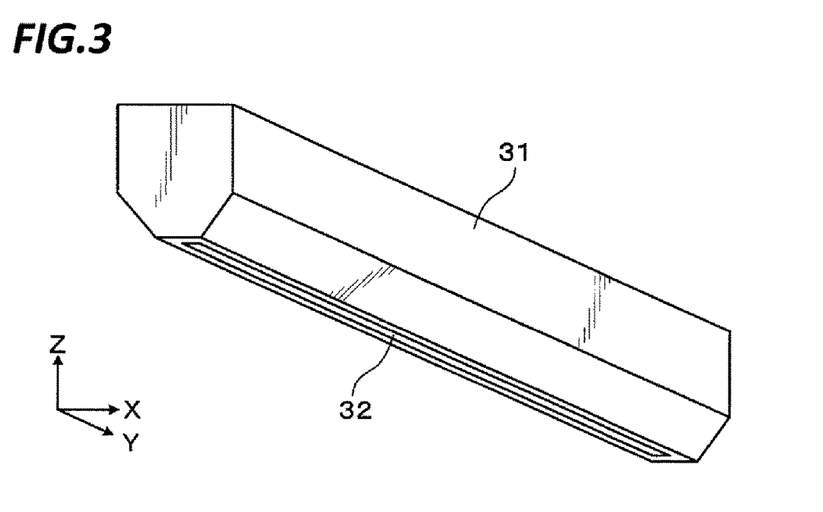
FIG. 3 is a perspective view illustrating a configuration of a first coating nozzle.

The first coating section 30 includes a first coating nozzle 31 configured to eject a coating liquid to the wafer W. The first coating nozzle 31 is an elongated nozzle extending in the direction (Y-axis direction) perpendicular to the moving direction (X-axis direction) of the wafer W, and is disposed above the wafer W held by the wafer holding unit 21. As illustrated in FIG. 3, an ejection port 32 formed in the lower end surface of the first coating nozzle 31 to eject the coating liquid to the wafer W. The ejection port 32 is a slit-like ejection port extending to a length larger than the diameter of the wafer W along the longitudinal direction (Y-axis direction) of the first coating nozzle 31.

As illustrated in FIG. 1, the first coating nozzle 31 is connected with a supply pipe 33 configured to supply a coating liquid to the first coating nozzle 31. The supply pipe 33 is communicated with the coating liquid supply source 34 that stores the coating liquid therein. Also, the supply pipe 33 is equipped with a supply device group 35 including a valve and a flow rate regulator that control the flow of the coating liquid.

As illustrated in FIGS. 1 and 2, the first coating section 30 further includes a lifting mechanism 36 configured to raise and lower the first coating nozzle 31 in the vertical direction (Z axis direction). The lifting mechanism 36 includes a fixing unit 37 and a drive unit 38. The fixing unit 37 is a member configured to fix the first coating nozzle 31. In addition, the drive unit 38 has a gate-type structure extending in the horizontal direction (Y axis direction) and the vertical direction and is laid between the both sides of the drive unit 22. The drive unit 38 moves the fixing unit 37 in the vertical direction. The lifting mechanism 36 moves the fixing unit 37 in the vertical direction using the drive unit 38 so as to raise and lower the first coating nozzle 31 fixed to the fixing unit 37.

The first drying section 40 includes a first heating mechanism 41 that heats the wafer W, and a support unit 42 that supports the first heating mechanism 41. The first heating mechanism 41 extends to a length longer than the diameter of the wafer W in the horizontal direction (Y-axis direction). As for the first heating mechanism 41, any mechanism may be used so long as it can heat the wafer W. For example, a lamp heater is used. The support unit 42 has a gate-type structure extending in the horizontal direction (Y-axis direction) and the vertical direction and laid between the both sides of the drive unit 22. The first drying section 40 heats the wafer W by the heating mechanism 41 so as to dry the coating liquid on the wafer W.

The second coating section 50 has the same configuration as the first coating section 30, and includes a second coating nozzle 51 (ejection port 52), a supply tube 53, a coating liquid supply source 54, a supply device group 55, a lifting mechanism 56, a fixing unit 57, and a drive unit 58. In addition, the coating liquid supply source 54 and the coating liquid supply source 34 may be a common one.

The second drying section 60 has the same configuration as the first drying section 40 and includes a second heating mechanism 61 and a support unit 62.

In addition to the mounting table 10, the moving mechanism 20, the first coating section 30, the first drying section 40, the second coating section 50, and the second drying section 60, the substrate processing apparatus 1 may be provided with, for example, a heat insulating plate (not illustrated) between each two adjacent sections among the first coating section 30, the first drying section 40, the second coating section 50, and the second drying section 60. In such a case, each of the heating mechanisms 41, 61 may be maintained at a constant temperature, or an on/off-control may be performed depending on the presence or absence of the wafer W. Moreover, the substrate processing apparatus 1 may also be provided with, for example, a nozzle cleaning unit (not illustrated) configured to remove the coating liquid adhered to the respective tips of the coating nozzles 31, 51, a nozzle standby section (not illustrated) configured to accommodate the coating nozzles 31, 51, and a moving mechanism (not illustrated) configured to move the nozzle cleaning unit or the nozzle standby section.

The substrate processing apparatus 1 described above is provided with a controller 100 as illustrated in FIG. 1. The controller 100 is, for example, a computer and includes a program storage unit (not illustrated). The program storage unit is stored with, for example, a program that controls the coating operations by the coating sections 30, 50, the drying operations by the drying sections 40, 60, the moving operation of the wafer W by the moving process mechanism 20 so as to control the substrate processings in the substrate processing apparatus 1. In addition, the program storage unit is also stored with a program that controls the operations of various other driving systems so as to realize the substrate processings in the substrate processing apparatus 1. Further, the programs may be stored in a computer-readable storage medium H such as a computer-readable hard disk (HD), a flexible disk (FD), a compact disk (CD), a magnet-optical disk (MO), and a memory card, and installed in the controller 100 from the storage medium H when they are used.

Next, descriptions will be made on the substrate processing processes performed in the substrate processing apparatus 1 configured as above.

In performing the substrate processing, first, the wafer W is carried into the substrate processing apparatus 1 by a conveyance mechanism (not illustrated). The wafer W carried into the substrate processing apparatus 1 is mounted, attracted and held on the wafer holding unit 21. Then, the wafer W is moved by the moving mechanism 20 in the horizontal direction (positive X-axis direction) so that the coating process (step S1) by the first coating section 30, the drying process (step S2) by the first drying section 40, the coating process (step S3) by the second coating section 50, and the drying process (step S4) by the second drying section 60 are performed sequentially.

In the first coating process by the coating section 30 in step S1, first, the first coating nozzle 31 is located at a predetermined height by the lifting mechanism 36. The predetermined height is set depending on a target film thickness of the coating liquid C1 in step S1. Also, the coating liquid C1 is supplied to the first coating nozzle 31 from the coating liquid supply source 34, and exposed from the ejection port 32 of the first coating nozzle 31 by the surface tension. Then, when the wafer W passes through a lower side of the first coating nozzle 31, the coating liquid C1 is in contact with the wafer W.

Figure 4:
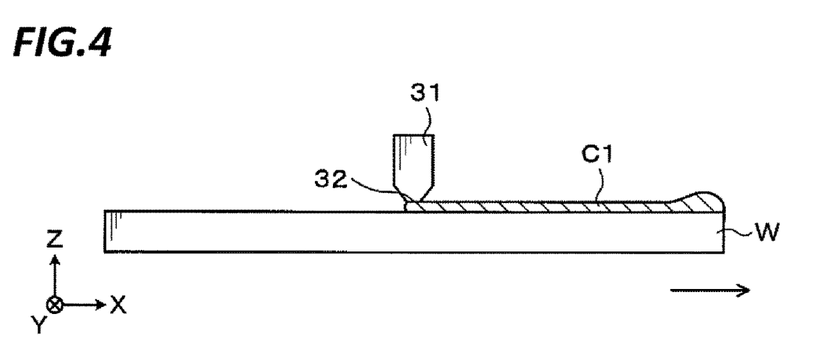
FIG. 4 is an explanatory view of a substrate processing operation by the substrate processing apparatus.

In this manner, when the coating liquid C1 is in contact with the wafer W to form a liquid pool of the coating liquid between the ejection port 32 and the wafer W, the wafer W is moved in the horizontal direction (positive X-axis direction), while causing the coating liquid C1 to be in contact with the wafer W as illustrated in FIG. 4. Then, the coating liquid C1 is drawn out of the ejection port 32 by a capillary phenomenon, and the coating liquid C1 is coated on the wafer W.

Figure 5:
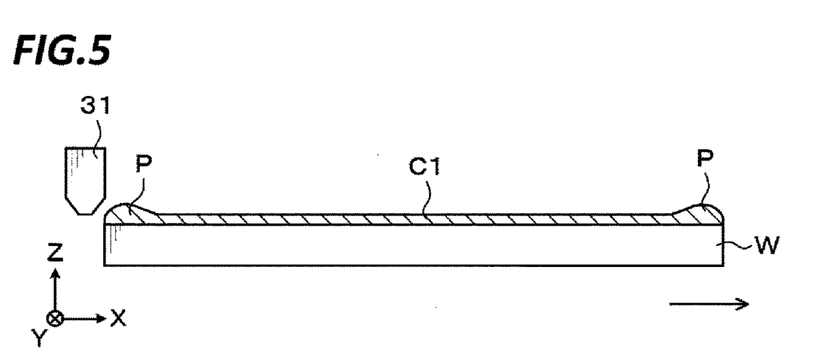
FIG. 5 is an explanatory view of a substrate processing operation by the substrate processing apparatus.
Figure 6:
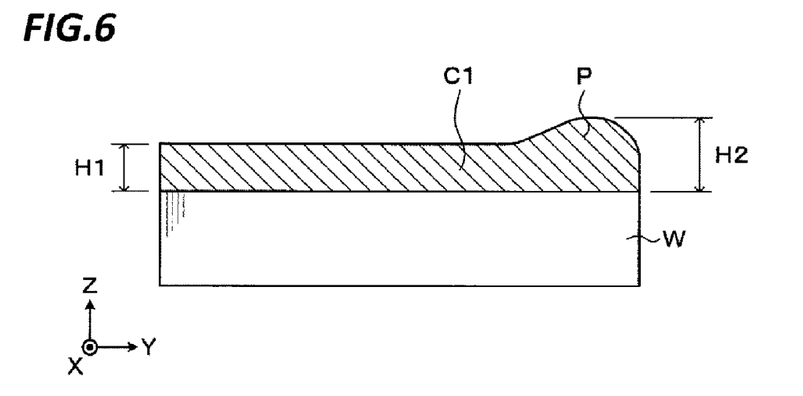
FIG. 6 is an explanatory view of a substrate processing operation by the substrate processing apparatus.

Then, the coating liquid C1 is applied to the entire surface of the wafer W as illustrated in FIG. 5. At this time, the coating liquid C1 swells in the outer peripheral portion of the wafer W as illustrated in FIG. 6 to form a hump P. That is, when the target thickness of the coating liquid C1 in step S1 is H1, the height of the hump P becomes H2 which is greater than H1. In the present exemplary embodiment, since the coating liquid is coated on the wafer W in two steps of steps S1 and S3, for example, the height and width of the hump P may be reduced as compared to the case of applying the coating liquid in one step.

Figure 7:
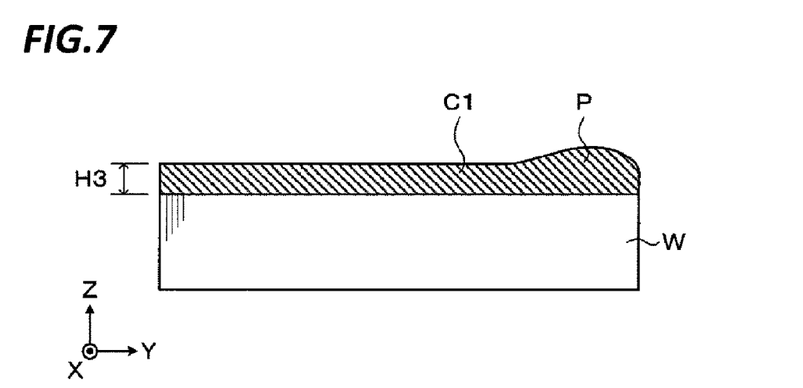
FIG. 7 is an explanatory view of a substrate processing operation by the substrate processing apparatus.

Subsequently, in the drying process by the first drying section 40 in step S2, the moving wafer W is heated by the first heating mechanism 41 to a predetermined temperature. Thus, the coating liquid C1 is dried and solidified on the wafer W as illustrated in FIG. 7. Furthermore, since the solvent component in the coating liquid C1 is volatilized as the coating liquid C1 is dried, the film thickness of the coating liquid C1 (coating film) becomes H3 which is smaller than H1.

Thereafter, in the coating process by the second coating section 50 in step S3, first, the second coating nozzle 51 is located at a predetermined height by the lifting mechanism 56. Also, the coating liquid C2 is supplied to the second coating nozzle 51 from the coating liquid supply source 54 and the coating liquid C2 is exposed from the ejection port 52 of the second coating nozzle 51 by the surface tension. Then, when the wafer W passes through the lower side of the second coating nozzle 51, the coating liquid C2 is in contact with the wafer W.

Figure 8:
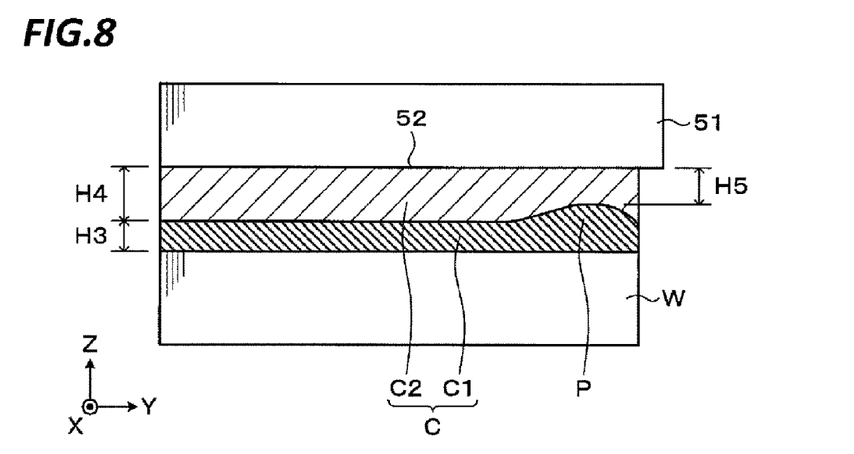
FIG. 8 is an explanatory view of a substrate processing operation by the substrate processing apparatus.

As illustrated in FIG. 8, the target film thickness of the coating liquid C2 ejected from the second coating nozzle 51 in step S3 is H4, which is equal to the target film thickness H1 of the coating liquid C1 in step S1. The predetermined height of the second coating nozzle 51 described above is set to the target height (=H3+H4).

When the coating liquid C2 is in contact with wafer W in this manner and a liquid pool of the coating liquid C2 is formed between the ejection port 52 and the wafer W, the wafer W is moved in the horizontal direction (positive X-axis direction) while causing the coating liquid C2 to be in contact with the wafer W. Then, the coating liquid C2 is drawn out of the ejection port 52 by the capillary phenomenon, thus being coated on the wafer W.

Figure 9:
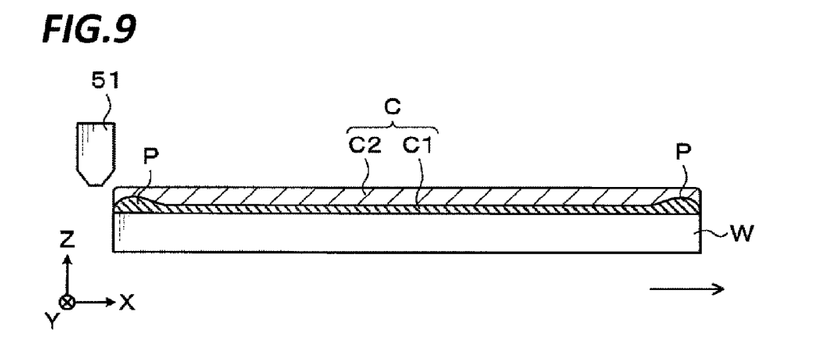
FIG. 9 is an explanatory view of a substrate processing operation by the substrate processing apparatus.

At this time, as illustrated in FIG. 8, the distance H5 between the ejection port 52 and the surface of the hump P in the outer peripheral portion of the wafer W is smaller than the distance H4 between the surface of the coating liquid C1 and the ejection port 52 in the inner peripheral portion. Then, the supply amount of the coating liquid C2 ejected from the second coating nozzle 51 is controlled so that the film thickness H5 of the coating liquid C2 coated in the outer peripheral portion from the second coating nozzle 51 is smaller than the film thickness H4 of the coating liquid C2 coated in the inner peripheral portion. That is, the supply amount of the outer peripheral portion of the coating liquid C2 is smaller than the supply amount of the inner peripheral portion of the coating liquid C2. Since the supply amount of the outer peripheral portion of the coating liquid C2 is thus small, the hump P is hardly formed on the outer periphery of the coating liquid C2. Therefore, the outer peripheral portion and the inner peripheral portion of the coating liquid C2 may be set to have the same surface height. Then, as illustrated in FIG. 9, the coating liquid C (composed of the coating liquids C1, C2) is applied in a uniform thickness on the entire surface of the wafer W.

Figure 10:
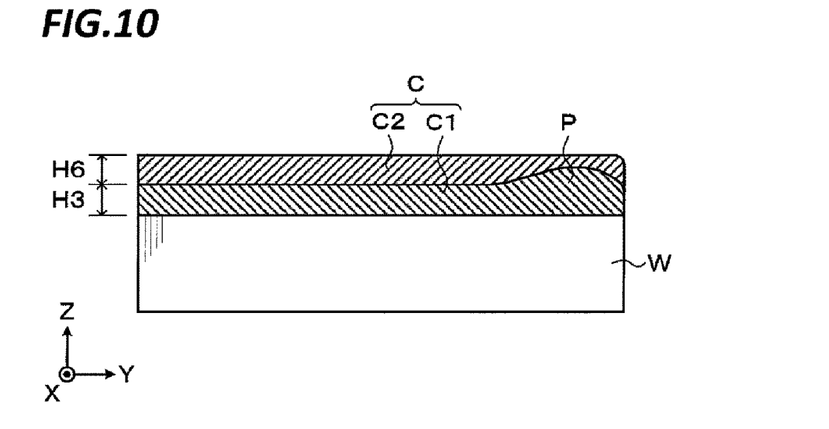
FIG. 10 is an explanatory view of a substrate processing operation by the substrate processing apparatus.

Then, in the drying process by the second drying section 60 in step S4, the moving wafer W is heated to a predetermined temperature by the second heating mechanism 61. Then, the coating liquid C2 on the wafer W is dried and solidified as illustrated in FIG. 10. Since the solvent component in the coating liquid C2 is volatilized as the coating liquid C2 is dried, the film thickness of the coating liquid C2 (coating film) becomes H6 which is smaller than H4.

Thus, a coating film with a target film thickness (=H3+H6) is formed on the wafer W, and a series of substrate processings are terminated in the substrate processing apparatus 1.

According to the foregoing exemplary embodiments, in step S1, as the coating liquid C1 swells in the outer peripheral portion of the substrate, a hump P is formed. As a result, in step S3, the distance H5 between the surface of the hump P and the ejection port 52 in the outer peripheral portion of the wafer W is smaller than the distance H4 between the surface of the coating liquid C1 and the ejection port 52 in the inner peripheral portion, and thus, the film thickness of the coating liquid C2 to be ejected to the outer peripheral portion from the coating nozzle 51 is controlled to be smaller than the film thickness of the coating liquid C2 ejected to the inner peripheral portion. For this reason, the inner peripheral portion and the outer peripheral portion of the coating liquid C2 may be made to have the same surface height, the coating liquid C may be coated uniformly in the wafer plane.

In addition, the target film thickness H1 of the coating liquid C1 in step S1 is the same as the target film thickness H4 of the coating liquid C2 in step S3. Here, for example, when the target film thickness H1 is larger than the target film thickness H4, the height H2 of the hump P formed in step S1 is increased. Meanwhile, in step S3, the thickness H5 of the coating liquid C2 supplied to the outer peripheral portion of the wafer W in step S3 is decreased, and thus, the supply amount of the coating liquid C2 is decreased so that the impact of the hump P may not be absorbed in step S3. In this respect, since the target film thicknesses of H1 and H4 in steps S1 and S3 in the present exemplary embodiment are the same, the impact of the hump P in step S3 may be reliably absorbed so that the coating liquid C may be uniformly coated in the wafer plane.

In addition to the formation of the hump P in the outer peripheral portion of the coating liquid C1, in step S1, the film thickness may become non-uniform even in the inner peripheral portion of the coating liquid C1 in some cases. Even in such cases, according to the present exemplary embodiment, the supply amount of the coating liquid C2 from the second coating nozzle 51 is automatically controlled depending on the film thickness of the coating liquid C1. That is, when the distance between the surface of the coating liquid C1 and the ejection port 52 is small, the supply amount of the coating liquid C2 is reduced. When the distance between the coating liquid C1 and the ejection port 52 is large, the supply amount of the coating liquid C2 is increased. Therefore, when the coating liquid C2 is coated in step S3, the film thickness of the coating liquid C becomes uniform even in the inner peripheral portion of the wafer W, so that the coating liquid C can be uniformly coated in the wafer plane.

Further, the hump P formed in the outer peripheral portion of the wafer W in step S1 is formed by being influenced by, for example, the viscosity or surface tension of the coating liquid C1, and the wettability of the wafer W. That is, the height and width of the hump P vary according to the properties of the coating liquid C1. In this respect, since the supply amount of the coating liquid C2 is automatically controlled according to the height of the hump P in step S3, the coating liquid C can be always uniformly coated in the wafer plane without depending on the characteristics of the coating liquid C1.

Since the capillary coating method is used in steps S1 and S3, the coating liquids C1, C2 supplied to the wafer W do not flow out of the wafer W. Thus, the required amount of the coating liquids C1, C2 may be supplied to the wafer W. Thus, for example, the supply amount of the coating liquid C can be reduced as compared with the spin coating method.

Since the first coating section 30, the first drying section 40, the second coating section 50, and the second drying section 60 are disposed within the same substrate processing apparatus 1, the processings of steps S1 to S4 may be successively performed on the wafer W. Therefore, the substrate processing throughput may be improved.

In the above-described exemplary embodiment, the coating liquid C1, C2 is coated on the wafer W in two steps, but the number of steps of coating the coating liquid is not limited thereto. For example, the coating liquid may be coated in three or more steps. As the number of steps of coating the coating liquid increases, the film thickness uniformity of the coating liquid on the wafer W may be improved. However, the target film thicknesses in respective coating steps may be set to be equal to each other, as described above.

The substrate processing apparatus of the present disclosure may take various configurations without being limited to the configuration of the substrate processing apparatus 1 of the exemplary embodiments described above.

Figure 11:
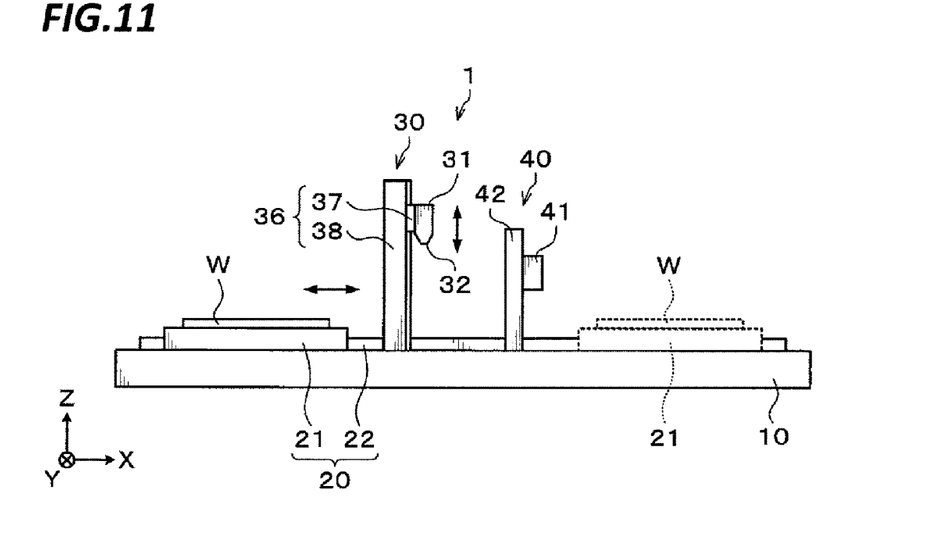
FIG. 11 is a schematic side view illustrating a configuration of a substrate processing apparatus according to another exemplary embodiment.

For example, as illustrated in FIG. 11, only the first coating section 30 and the first drying section 40 may be provided in the substrate processing apparatus 1 while the second coating section 50 and the second drying section 60 may be omitted from the substrate processing apparatus 1. In such a case, the coating process is performed by the first coating section 30 in step S1, and the drying process is performed by the first drying section 40 in step S2. Subsequently, the wafer W is moved in the horizontal direction (negative X-axis direction) by the movement mechanism 20 and then the wafer W is returned to its original starting position (negative X-axis direction side of the first coating section 30). Then, the wafer W is moved again in the horizontal direction (positive X-axis direction), and the coating processing is performed by the second coating section 50 in step S3. The drying process is performed by the first drying section 40 in step S4.

Also, the present exemplary embodiment may have the same effects as the exemplary embodiments described above. That is, the coating liquid C may be uniformly coated in the wafer plane while suppressing the supply amount of the coating liquid C coated on the wafer W to a small amount. Moreover, the area occupied by the substrate processing apparatus 1 may be reduced.

In the present exemplary embodiment, step S3 is performed after steps S1 and S2 and after the wafer W is returned to its original starting position. However, step S3 may be performed in the course of returning the wafer W. In such a case, the direction of coating the coating liquid C2 in step S1 and the direction of coating the coating liquid C1 in step S3 are different from each other.

Figure 12:
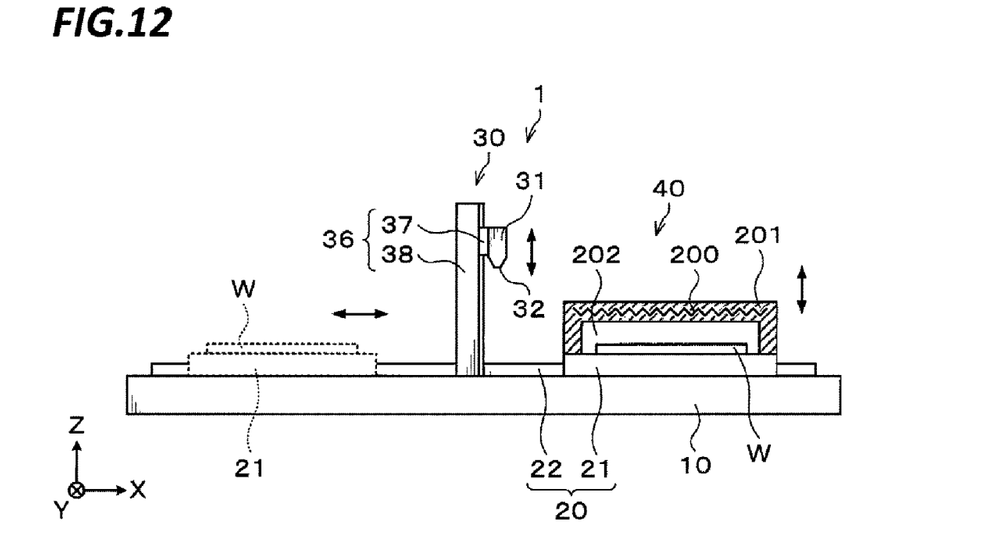
FIG. 12 is a schematic side view illustrating the configuration of the substrate processing apparatus according to another exemplary embodiment.
Figure 13:
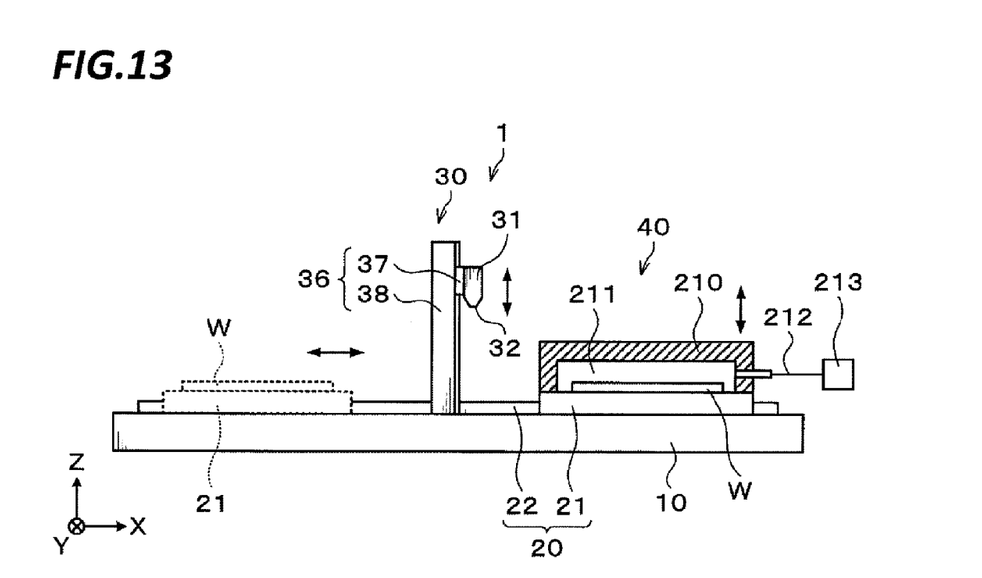
FIG. 13 is a schematic side view illustrating a configuration of the substrate processing apparatus according to another exemplary embodiment.

In addition, the first drying section 40 and the second drying section 60 in the substrate processing apparatus 1 may also take any configurations. FIGS. 12 and 13 illustrate modifications of the configuration of the first drying section 40. While FIGS. 12 and 13 illustrate the first drying section 40 only, the configuration of the second drying section 60 may be the same as the configuration of the first drying section 40 when the second coating section 50 and the second drying section 60 are provided in the substrate processing apparatus 1.

As illustrated in FIG. 12, the first drying section 40 may include a lid 201 with a heating mechanism 200 built therein. As for the heating mechanism 200, any mechanism may be used so long as it is capable of heating the wafer W. For example, a heater may be used as the heating mechanism 200. The lid 201 is configured to be raised and lowered in the vertical direction by a lifting mechanism (not illustrated). Further, the lid 201 is bottom-opened and configured to cover wafer holding unit 21, and integrated with the wafer holding unit 21 to form a processing space 202.

In such a case, when the wafer W is disposed below the lid 201 in step S2, the lid 201 is lowered to form the processing space 202. Then, the wafer W is heated to a predetermined temperature so that the coating liquid C1 on the wafer W is dried.

As illustrated in FIG. 13, the first drying section 40 may decompress the peripheral atmosphere around the wafer W so as to dry the coating liquid C1. The first drying section 40 includes a lid 210. The lid 210 is configured to be raised and lowered in the vertical direction by a lifting mechanism (not illustrated). In addition, the lid 210 is bottom-opened to cover the wafer holding unit 21, and integrated with the wafer holding unit 21 to form a processing space 211. Further, the first drying section 40 includes an intake pipe 212 configured to suck the atmosphere in the processing space 211, and an intake device 213 such as, for example, a vacuum pump connected to the intake pipe 212.

In this case, when the wafer W is disposed below the lid 210 in step S2, the lid 210 is lowered to form the processing space 211. Then, the atmosphere in the processing space 211 is decompressed to a predetermined pressure by the intake unit 213 so that the coating liquid C1 on the wafer W is dried.

Any of the substrate processing apparatuses 1 illustrated in FIGS. 12 and 13 may properly dry the coating liquids C1, C2 on the wafer W, and the same effects as the exemplary embodiments described above may be achieved.

Also, although not illustrated, a heating mechanism may be provided within the wafer holding unit 21 while omitting the first drying section 40 and the second drying section 60.

While the substrate processing apparatus 1 of the exemplary embodiments described above relatively moves the wafer W and the coating nozzles 31, 35 by moving the wafer W in the horizontal direction by the moving mechanism 20, the coating nozzles 31, 51 may be individually moved in the horizontal direction. Alternatively, the both the coating nozzles 31, 51 and the wafer W may be moved in the horizontal direction.

Figure 14:
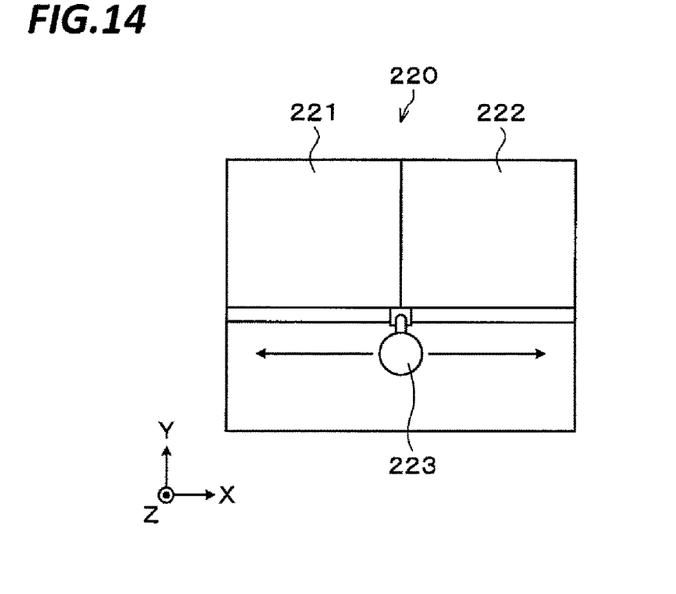
FIG. 14 is a schematic plan view illustrating a configuration of the substrate processing apparatus according to another exemplary embodiment.

In addition, in the exemplary embodiments described above, the coating processes by the coating sections 30, 50 and the drying processes by the drying sections 40, 60 are performed in the same substrate processing apparatus 1. However, the drying processes and the coating processes may be performed in different apparatuses. For example, as illustrated in FIG. 14, the substrate processing apparatus 220 includes a coating device 221 and a drying section 222. The coating device 221 coats the coating liquid on a wafer W by a capillary coating method. The drying device 222 dries the coating liquid by heating the wafer W or by depressurizing the atmosphere around the wafer W. As for the coating device 221 and the drying device 222, devices known to perform respective processes may be used. In addition, the conveyance of the wafer W between the coating section 221 and the drying section 222 is performed using, for example, a conveyance device 223.

In such a case, the coating processes in steps S1, S3 are properly performed in the coating device 221. The drying processes of steps S2, S4 are properly performed in the drying device 222. Even in the present exemplary embodiment, the same effects as the exemplary embodiments described above may be achieved.

In the exemplary embodiments described above, the coating liquid C1 is coated on the entire surface of the wafer W in step S1. However, the coating liquid C1 may be coated only in the outer peripheral portion of the wafer W.

Figure 15:
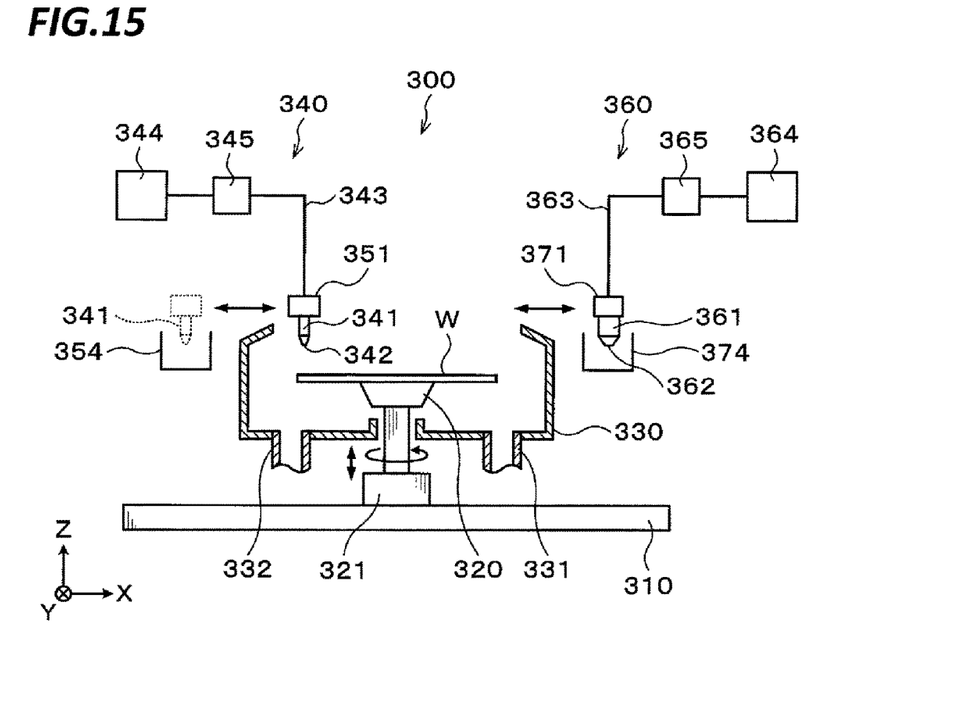
FIG. 15 is a schematic side view illustrating the configuration of the substrate processing apparatus according to another exemplary embodiment.
Figure 16:
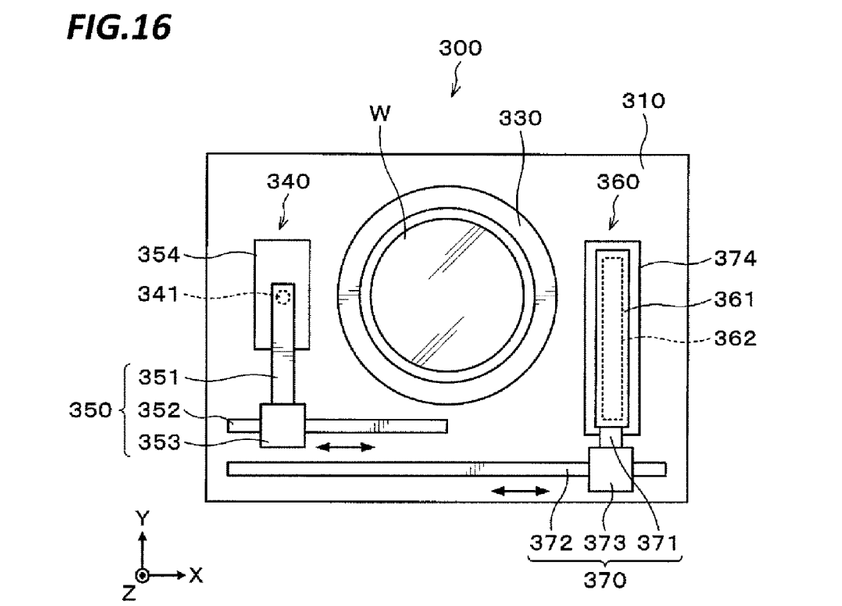
FIG. 16 is a schematic plan view illustrating a configuration of the substrate processing apparatus according to another exemplary embodiment.

FIGS. 15 and 16 illustrate a substrate processing apparatus 300 for coating a coating liquid C to on a wafer W. The substrate processing apparatus 300 includes a processing chamber 310, a spin chuck 320, a cup 330, a first coating section 340, a first moving mechanism 350, a second coating section 360, and a second moving mechanism 370. The processing container 310 is configured to be capable of sealing the interior thereof. Meanwhile, FIGS. 15 and 16 illustrate only the bottom portion of the processing container 310.

The spin chuck 320 is installed in the central portion in the processing container 310 and configured to hold and rotate the wafer W. The spin chuck 320 has a horizontal upper surface on which, for example, a suction port is formed so as to suck the wafer W (not shown) is formed. By the sucking from this suction port, the wafer W may be attracted to and held on the spin chuck 320.

Below the spin chuck 320, the chuck drive unit 321 including, for example, a motor, is installed. The spin chuck 320 may be rotated at a predetermined speed by the chuck drive unit 321. Also, the chuck drive unit 321 is provided with a lifting drive source, and the spin chuck 320 is configured to be capable of being raised and lowered.

Around the spin chuck 320, the cup 330 is installed to receive and recover the liquid from scattered or dropped from the wafer W. To the lower surface of the cup 330, a discharge pipe 331 configured to discharge the recovered liquid, and an exhaust pipe 332 configured to evacuate and exhaust the atmosphere within the cup 330 is connected.

The first coating section 340 includes a first coating nozzle 341 configured to eject a coating liquid C1 to the wafer W. In the lower end surface of the first coating nozzle 341, a circular ejection port 342 configured to eject the coating liquid C1 to the wafer W is formed.

The first coating nozzle 341 is connected with the supply pipe 343 configured to supply the coating liquid C1 to the first coating nozzle 341. The supply pipe 343 is communicated with a coating liquid supply source 344 that stores the coating liquid C1 therein. In addition, the supply tube 343 is provided with a supply device group 345 including, for example, a valve and a flow rate controller that control the flow of the coating liquid C1.

The first moving mechanism 350 is configured to move the first coating nozzle 341 in the horizontal direction (X-axis direction), and includes an arm 351, a rail 352, and a nozzle driver unit 353. The arm 351 supports the first coating nozzle 341. The rail 352 extends along the X-axis direction in the negative Y-axis direction side of the cup 330. The rail 352 is formed, for example, from the outside of the negative X-axis direction side of the cup 330 to the vicinity of the center of the cup 330. The nozzle drive unit 353 is provided on the rail 352 so as to move the arm 351 in the horizontal direction.

The first moving mechanism 350 moves the arm 351 along the rail 352 using the nozzle drive unit 353 so as to move the first coating nozzle 341 from the standby section 354 installed outside the cup 330 in the negative X-axis direction to the upper side of the outer peripheral portion of the wafer W in the cup 330 and move the first coating nozzle 341 in the radial direction of the wafer W above the wafer W. Further, the first moving mechanism 350 raises and lowers the arm 351 using the nozzle drive unit 353 so as to adjust the height of the first coating nozzle 341.

The second coating section 360 includes a second coating nozzle 361 configured to eject the coating liquid C2 to the wafer W. The second coating nozzle 361 is an elongated nozzle extending in the Y-axis direction. In the lower end surface of the second coating nozzle 361, an ejection port 362 is formed to eject the coating liquid C2 to the wafer. The ejection port 362 is a slit-like ejection port extending by a length greater than the diameter of the wafer W along the longitudinal direction (Y-axis direction) of the second coating nozzle 361.

The second coating nozzle 361 is connected with the supply pipe 363 configured to supply the coating liquid C2 to the second coating nozzle 361. The supply pipe 363 is communicated with the coating liquid supply source 364 that stores the coating liquid C2 therein. In addition, the supply pipe 363 is provided with a supply device group 365 including a valve and a flow rate controller that control the flow of the coating liquid C2. Further, the coating liquid supply source 364 and the coating liquid supply source 344 may be a common one.

The second moving mechanism 370 is configured to move the second coating nozzle 361 in the horizontal direction (X-axis direction), and includes an arm 371, a rail 372, and a nozzle drive unit 373. The arm 371 supports the second coating nozzle 361. The rail 372 extends along the X-axis direction at the negative Y-axis direction side of the rail 352. The rail 372 is formed, for example, from the outside of the cup 330 at the negative X-axis direction side to the outside of the cup 330 in the positive X-axis direction, The nozzle drive unit 373 is provided on the rail 372. so as to move the arm 371 in the horizontal direction.

The second moving mechanism 370 moves the arm 371 along the rail 372 using the nozzle drive unit 373 so as to move the second coating nozzle 361 from the standby section 374 provided outside the cup 330 in the positive X-axis direction to the upper side of the outer peripheral portion of the wafer W in the cup 330, and to move the second coating nozzle 361 in e radial direction of the wafer W above the wafer W. In addition, the second moving mechanism 370 raises and lowers the arm 371 using the nozzle drive unit 373 so as to adjust the height of the second coating nozzle 361.

Further, in the present exemplary embodiment, the arm 351 supporting the first coating nozzle 341 and the arm 371 supporting the second coating nozzle 361 are attached to the separate rails 352, 372, respectively. However, the arms 351 and 371 may be attached to the same rail. Also, the first coating nozzle 341 and the second coating nozzle 361 are supported by the separate arms 351, 371, respectively, However, the first and second coating nozzles 341, 361 may be supported on the same arm.

In addition, in the substrate processing apparatus 300, the first coating section 340 and the second coating section. 360 are provided in the processing container 310, and the drying process of the coating liquids C1, C2 on the wafer W is performed in the outside of the processing container 310. The drying process may a process of drying the coating liquids C1, C2 by heating the wafer W, or a process of drying the coating liquids C2 by decompressing the atmosphere around he wafer W. Further, within the processing container 310, for example, a heating mechanism such as, for example, a lamp heater may be provided as a drying unit so as to perform the drying process.

In performing the substrate processing in the substrate processing apparatus 300 configured as described above, first, the wafer W is carried into the substrate processing apparatus 1 by a conveyance mechanism (not illustrated). The wafer W carried into the substrate processing apparatus 300 is delivered to the spin chuck 320 to be adsorbed and held by the spin chuck 320.

Figure 17:
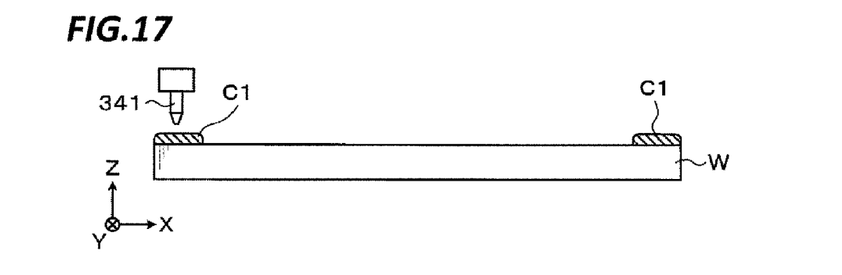
FIG. 17 is an explanatory view of a substrate processing operation by the substrate processing apparatus according to still another exemplary embodiment.

Subsequently, the coating process of step S1 is performed. In step S1, first, the first coating nozzle 341 in the standby section 354 is moved up to the upper side of the outer peripheral portion of the wafer W by the first moving mechanism 350. Then, as illustrated in FIG. 17, the coating liquid C1 is ejected to the outer peripheral portion of the wafer W from the first coating nozzle 341 while the wafer W is being rotated by the spin chuck 320. Then, the coating liquid C1 is coated on the outer peripheral portion of the wafer W in an annular shape.

Subsequently, in step S2, the drying process of the coating liquid C1 is performed in the outside of the processing container 310.

Thereafter, the coating process of step S3 is performed. In step S3, first, the second coating nozzle 361 in the standby section 374 is moved up to the upper side of the outer peripheral portion of the wafer (W) by the second moving mechanism 370, and the second coating nozzle 361 is located at a predetermined height. Also, the coating liquid C2 is supplied to the second coating nozzle 361 from the coating liquid supply source 364, and the coating liquid C2 is exposed from the ejection port 362 of the second coating nozzle 361 by the surface tension. In addition, the coating liquid C2 is caused to be in contact with the outer peripheral portion of the wafer W.

When the coating liquid C2 is in contact with the wafer W in this manner and then a liquid pool of the coating liquid C2 is formed between the ejection port 362 and the wafer W, the second coating nozzle 361 is moved in the horizontal direction (negative X-axis direction) while causing the coating liquid C2 to be in contact with the wafer W. Then, the coating liquid C2 is drawn out of the ejection port 362 by the capillary phenomenon and coated on the wafer W.

Figure 18:
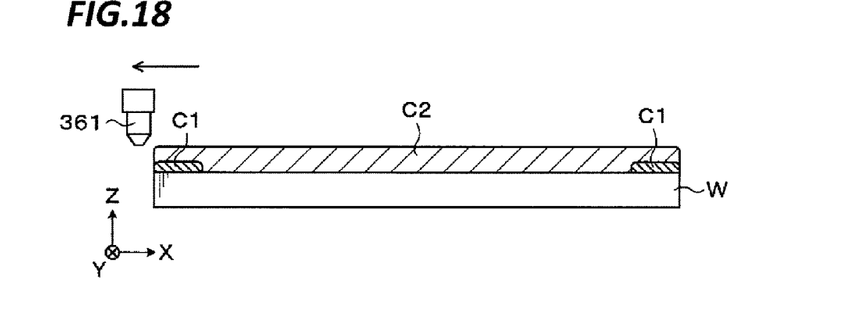
FIG. 18 is an explanatory view of a substrate processing operation by the substrate processing apparatus according to still another exemplary embodiment.

At this time, the distance between the surface of the coating liquid C1 and the ejection port 362. in the outer peripheral portion of the wafer W is smaller than the distance between the surface of the wafer W and the ejection port 362 in the inner peripheral portion, Then, the supply amount of the coating liquid C2 discharged from the second coating nozzle 361 is controlled such that the film thickness of the coating liquid C2 coated on the outer peripheral portion of the second coating nozzle 361 becomes smaller than the film thickness of the coating liquid C2 coated on the inner peripheral portion, That is, the supply amount of the outer peripheral portion of the coating liquid C2 is smaller than the supply amount of the inner peripheral portion of the coating C2. Thus, since the supply amount of the outer peripheral portion of the coating liquid C2 is small, the hump P is hardly formed on the outer peripheral portion of the coating liquid C2. For this reason, the inner peripheral portion and the outer peripheral portion of the coating liquid C2 may have the same surface height. Then, as illustrated in HG, 18, the coating liquid C (composed of the coating liquids C1, C2) is coated in uniform film thickness on the entire surface of the wafer W.

Subsequently, in step S4, the drying process of the coating liquid C2 on the wafer W is performed in the outside the processing container 310. Thus a series of substrate processings in the substrate processing apparatus 300 are terminated.

Even in the present exemplary embodiment, the same effects as the exemplary embodiments described above may be achieved. That is, the coating liquid C may be uniformly coated in the wafer plane while suppressing the supply amount of the coating liquid C coated on the wafer W to a small amount.

In the substrate processing apparatus 300 according to the exemplary embodiments described above, the coating nozzles 341, 361 in the horizontal direction are moved by the moving mechanisms 350, 370 so as to relatively move the wafer W and the coating nozzle 341, 361. However, the wafer W may be moved in the horizontal direction, Alternatively, the both the coating nozzles 341, 361 and the wafer W may be moved in the horizontal direction, In the exemplary embodiments described above, when the coating liquid is coated on the wafer W, the coating liquid is drawn out of each of the ejection ports 32, 52, 362 of the coating nozzles 31, 51, 361 by the capillary phenomenon, However, the method for supplying the coating liquid from coating nozzles 31, 51, 361 to the wafer W is not limited thereto. For example, the coating liquid may be ejected by force from the ejection ports 32, 52, 362 of the coating nozzles 31, 51, 361 by, for example, a pump.

As for the coating liquid used in the exemplary embodiments described above, any coating liquid may be used. For example, even in a case where an adhesive used for bonding substrates to each other, a coating liquid for sealing a circuit on a wafer W, or a coating liquid such as, for example, polyimide or a resist solution, is coated on a wafer, the present disclosure is applicable.

Further, the coating liquid C1 coated on the wafer W in step S1, and the coating liquid C2 coated on the wafer W in step S2 may be different from each other. For example, when bonding substrates to each other, three layers of a protective agent, a release agent, and an adhesive may be laminated. In such a case, the coating liquid C1 coated in step S1 may be a protective agent, the coating liquid C2 coated in step S2 may be a releasing agent, and a coating liquid C3 coated in a separate step may be an adhesive.

The present disclosure is applicable in a case where the substrate is not a wafer but a flat panel display (FPD) or a mask reticle for photomask, for example.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A substrate processing apparatus for coating a coating liquid including a first coating liquid and a second coating liquid on a substrate, the apparatus comprising:
    a first coating nozzle having a first ejection port which is slit-shaped and configured to eject the first coating liquid to a surface of the substrate from the first ejection port;
    a second coating nozzle having a second ejection port which slit-shaped and configured to eject the second coating liquid to a surface of the first coating liquid;
    a moving driver configured to relatively move the substrate and the first coating nozzle, and the second coating nozzle in a horizontal direction; and
    a controller configured to control the first coating nozzle, the second coating nozzle, and the moving driver,
    wherein the controller is programmed to control the first coating nozzle, the second coating nozzle, and the moving driver to sequentially perform:
    disposing the first coating nozzle at a height of a first target film thickness by the moving driver such that the first coating liquid ejected from the first coating nozzle is in contact with the surface of the substrate, to form a liquid pool of the first coating liquid between the first ejection port of the first coating nozzle and an outer peripheral portion of the substrate;
    moving the substrate and the first coating nozzle relatively with each other in the horizontal direction while causing the first coating liquid to be in contact with the surface of the substrate such that the first coating liquid is coated on an entire surface of the substrate, to form a hump having a height greater than the first target film thickness on an entire outer peripheral portion of the substrate;
    disposing, by the moving driver, the second coating nozzle at a height of a second target film thickness from a surface of the first coating liquid except for the hump such that the second coating liquid supplied from a second supply source is in contact with the hump, to form a liquid pool of the second coating liquid between the second ejection port of the second coating nozzle and the hump; and
    moving the substrate and the second coating nozzle relatively with each other in the horizontal direction while causing the second coating liquid to be in contact with the surface of the first coating liquid and controlling such that a supply amount of the second coating liquid ejected from the second ejection port to the hump is smaller than a supply amount of the second coating liquid ejected from the second ejection port to the surface of the first coating liquid except for the hump, to coat the second coating liquid on an entire surface of the first coating liquid.

2. The substrate processing apparatus according to claim 1 wherein, in the moving the substrate and the first coating nozzle relatively, the controller is programmed to control the first coating nozzle to eject and coat the first coating liquid only to the outer peripheral portion of the substrate.

3. The substrate processing apparatus according to claim 1, wherein the controller is programmed to set the first target film thickness of the first coating liquid and the second target film thickness of the second coating liquid to be equal to each other.

4. The substrate processing apparatus according to claim 2, wherein the controller is programmed to set the first target film thickness of the first coating liquid and the second target film thickness of the second coating liquid to be equal to each other.

5. The substrate processing apparatus according to claim 1, wherein the controller is programmed to control the second coating nozzle and the moving driver to perform the moving the substrate and the second coating nozzle relatively with each other multiple times.

6. The substrate processing apparatus according to claim 5, wherein, in coating steps including the moving the substrate and the first coating nozzle and the moving the substrate and the second coating nozzle relatively with each other multiple times, the controller is programmed to set the first target film thicknesses of the first coating liquid and the second target film thickness of the second coating liquid in respective coating steps to be equal to each other.

7. The substrate processing apparatus according to claim 1, further comprising:
    a first dryer configured to dry the first coating liquid coated on the entire surface of the substrate; and
    a second dryer configured to dry the second coating liquid coated on the entire surface of the first coating liquid,
    wherein the controller is programmed to control the first dryer and the second dryer to perform:
    drying the first coating liquid coated in the moving the substrate and the first coating nozzle relatively by the first drying section, after the moving the substrate and the first coating nozzle relatively and before the moving the substrate and the second coating nozzle relatively; and
    drying the second coating liquid coated in the moving the substrate and the second coating nozzle relatively by the second drying section, after the moving the substrate and the second coating nozzle relatively.

8. The substrate processing apparatus according to claim 7, wherein the first coating nozzle, the second coating nozzle, the first dryer, and the second dryer are disposed in the same processing apparatus.

9. The substrate processing apparatus according to claim 7, wherein the first coating nozzle and the first dryer are disposed in different processing apparatus, and
    the second coating nozzle and the second dryer are disposed in different processing apparatuses.

10. The substrate processing apparatus according to claim 7, wherein the first dryer and the second dryer and configured to dry the first coating liquid and the second coating liquid, respectively by heating the substrate.

11. The substrate processing apparatus according to claim 7, wherein the first dryer and the second dryer are configured to dry the first coating liquid and the second coating liquid, respectively by decompressing an atmosphere around the substrate.

\* \* \* \* \*